(12) United States Patent
Suzuki

(10) Patent No.: US 7,630,273 B2
(45) Date of Patent: Dec. 8, 2009

(54) SEMICONDUCTOR INTEGRATED CIRCUIT

(75) Inventor: Toshikazu Suzuki, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/176,703

(22) Filed: Jul. 21, 2008

(65) Prior Publication Data
US 2009/0073745 A1   Mar. 19, 2009

(30) Foreign Application Priority Data
Sep. 13, 2007   (JP) ............................. 2007-237599

(51) Int. Cl.
*G11C 8/00* (2006.01)
(52) U.S. Cl. .................. 365/230.05; 365/154
(58) Field of Classification Search ........... 365/230.05, 365/154, 156
See application file for complete search history.

(56) References Cited

U.S. PATENT DOCUMENTS

| 6,091,629 | A  | * | 7/2000  | Osada et al. ................. 365/156 |
| 6,201,758 | B1 | * | 3/2001  | Morishima et al. ...... 365/230.05 |
| 6,483,754 | B1 | * | 11/2002 | Agrawal ................. 365/189.04 |
| 6,967,861 | B2 | * | 11/2005 | Braceras et al. ............. 365/154 |
| 7,113,421 | B2 |   | 9/2006  | Maeda et al. |
| 7,289,354 | B2 |   | 10/2007 | Houston |

OTHER PUBLICATIONS

Morita, Yasuhiro et al., "An Area-Conscious Low-Voltage-Oriented 8T-SRAM Design under DVS Environment," Symposium on VLSI Circuits Digest of Technical Papers, pp. 256-257, 2007.

* cited by examiner

*Primary Examiner*—Anh Phung
(74) *Attorney, Agent, or Firm*—McDermott Will & Emery LLP

(57) ABSTRACT

During a write cycle, a selected write-word-line driver drives the corresponding write word line such that the potential of the corresponding write word line is lower in a first period as a predetermined period after an initiation of the write cycle than in a second period as a predetermined period after the first period, and sense amplifiers amplify the potentials of the corresponding write bit lines in the first period.

4 Claims, 4 Drawing Sheets

SEMICONDUCTOR INTEGRATED CIRCUIT

BACKGROUND OF THE INVENTION

1. Field of the Invention

The present invention relates to a semiconductor integrated circuit comprising flip-flop memory cells and, more particularly, to a semiconductor integrated circuit intended to allow enlargement of a write operation to the memory cells.

2. Description of the Prior Art

With the recent process miniaturization, it has become extremely difficult to design a memory cell having stable characteristics for a semiconductor integrated circuit comprising flip-flop memory cells, such as a static random access memory (SRAM), due to variations in the characteristics of individual transistors composing the memory cells, and to the lower power source voltages. As a result, a lower production yield of the semiconductor integrated circuit resulting from the degradation of the operation margins of the memory cells has presented a problem. The operation margins of the memory cells include a write margin showing the ease of writing during data writing, and a static noise margin which is a margin for noise during data reading or data holding. In general, the write margin and the static noise margin have contradictory characteristics such that, when one of the margins is to be satisfied, the other margin decreases.

In general, a memory cell in a 1-port SRAM is composed of six transistors. When a write access is made to a memory cell array composed of the memory cells of a plurality of SRAMs, the gate of the access transistor of the selected memory cell is made conductive with a word line, and data is written from a bit line into the memory cell. At this time, however, the access transistors of the non-selected memory cells connected to the same word line also simultaneously become conductive, so that charges for precharging to a power source level Vdd flow into the storage node on the Low-level side of a flip-flop in the memory cell. As a result, the problem arises that the potential on the low-level side increases in the memory cell with a small static noise margin to invert the flip-flop and destroy stored data. With the miniaturization of the process of a semiconductor integrated circuit, the static noise margin has tended to be smaller so that the problem mentioned above has become serious.

As a prior-art technology for solving the problem, there is a method which uses memory cells each in a 8-transistor configuration, performs a read operation in advance to each of the selected cell and the non-selected cells without discrimination therebetween, latches read data, and rewrites the same data to the cells to prevent data destruction (see, e.g., "2007 Symposium on VLSI Circuits Digest of Technical Papers", pp. 256-257, which document is hereinafter referred to as Non-Patent Document 1). FIG. 4 shows a structure of a conventional semiconductor integrated circuit. FIG. 5 shows an operation timing diagram of the conventional semiconductor integrated circuit. Of the components shown in FIG. 4, those provided in a plurality of numbers are distinguished from each other by adding branch numbers to the ends of the reference numerals thereof (e.g., memory cells 210-1, 210-2, and the like).

In a memory cell array 200, a plurality of memory cells 210 are arranged in rows and columns. Each of the memory cells 210 has the same structure. The memory cell array 200 comprises pairs of word lines (a pair of RWL and WWL) placed correspondingly to the respective rows of the memory cells 210, read bit lines (RBL1 and RBL2) placed correspondingly to the respective columns of the memory cells 210, and pairs of bit lines (a pair of WBL1 and XWBL1, and a pair of WBL2 and XWBL2) placed correspondingly to the respective columns of the memory cells 210.

As shown in FIG. 4, each of the memory cells 210 is composed of eight transistors, which are PMOS transistor QP1 and QP2, and NMOS transistors QN1 to QN6.

The PMOS transistors QP1 and QP2, and the NMOS transistors QN1 and QN2 constitute a flip-flop for storing data.

The NMOS transistor QN3 has a drain connected to one of the pair of write bit lines (e.g., WBL1 in the memory cell 210-1). The NMOS transistor QN4 has a drain connected to the other of the pair of write bit lines (e.g., XWBL1 in the memory cell 210-1).

The NMOS transistor QN5 has a gate connected to one of the storage nodes of the flip flop, and the NMOS transistor QN6 has a gate connected to the read word line RWL such that data in the storage node is read into the read bit line (e.g., PBL1 in the memory cell 210, or RBL2 in the memory cell 210-2).

Inverters 220 are provided correspondingly to the respective columns of the memory cell array 200 to amplify and output data in the read bit lines corresponding to the columns. Specifically, the inverter 220-1 amplifies and outputs data in the read bit line RBL1, and the inverter 220-2 amplifies and outputs data in the read bit line RBL2.

Latch circuits 230 are provided correspondingly to the respective columns of the memory cell array 200, and connected to the read bit lines corresponding to the columns to hold read data. For example, the latch circuit 230-1 latches data in the read bit line RBL1 when a control signal DL is on a Low level.

Multiplexers 240 are provided correspondingly to the respective columns of the memory cell array 200 to select either of input data DIN and outputs of the inverters 220 corresponding to the columns based on column address signals. For example, the multiplexer 240-1 selects either of the input data DIN and the output DO1 (output of the latch circuit 230-1) based on a column address signal CA1.

Each of write circuits 250 is composed of AND circuits 251 and 252, and NMOS transistors QN10 and QN11. For example, in the write circuit 250-1, the AND circuits 251 and 252 receive an output DI1 and a write control signal WE. The NMOS transistor QN10 is controlled by an output of the AND circuit 251 to supply a ground level to the write bit line WBL1 or WBL2. The NMOS transistor QN11 is controlled by an output of the AND circuit 252 to supply the ground level to the write bit line XWBL1 or XWBL2.

A multiplexer 260 receives respective outputs DO1 and DO2 of the latch circuits 230-1 and 230-2, and outputs either of the outputs DO1 and DO2 as output data DOUT based on a column address signal CA.

An operation of the semiconductor integrated circuit shown in FIG. 4 will be described with reference to the operation timing diagram of FIG. 5.

In a non-selected state in which an access is not made to either of the memory cells 210-1 and 210-2, the read word line RWL, and the write word line WWL are each on the Low level, and the NMOS transistors QN3, QN4, and QN6 of the memory cells 210-1 and 210-2 are each non-conductive.

The write bit lines WBL1, WBL2, XWBL1, and XWBL2, and the read bit lines RBL1 and RBL2 are each charged to the power source level Vdd by a precharge circuit (not shown).

On the other hand, the write control signal WE, and the column address signals CA1, CA2, and CA are each on the Low level.

During a write cycle to the memory cell 210, the read word line RWL initially shifts from the Low level to a High level irrespective of in the write cycle. As a result, the NMOS transistors QN6 become conductive so that data stored in the memory cells 210-1 and 210-2 is read therefrom without discrimination between the selected memory cell and the non-selected memory cell. FIG. 5 illustrates the case where High data is stored in the storage nodes n1 (see FIG. 4), and the NMOS transistors QN5 are conductive.

Subsequently, charges on the read bit line RBL1 are discharged via the NMOS transistors QN5 and QN6, and the potential thereof gradually lowers from the level Vdd as the High level. Likewise, the read bit line RBL2 connected to the memory cell 210-2 is also discharged, or the potential thereof is maintained on the level Vdd in accordance with the stored data, though not shown in FIG. 5.

Subsequently, when the potential of the read bit line RBL1 reaches ½ Vdd as the threshold of the inverter 220, the level of the output DO1 is inverted to shift from the Low level to the High level.

Thereafter, the control signal DL shifts to the Low level to latch the levels of the output DO1 and DO2. At this time, the column address signal CA1 and CA2 are set to the High level and the Low level, respectively, and the multiplexer 240-1 corresponding to the memory cell 210-1 as the selected memory cell selects the input data DIN from between the input data DIN and the output DO1. As a result, the output DI1 is set to the Low level as the write level of the input data DIN. At the same time, the multiplexer 240-2 corresponding to the memory cell 210-2 as the non-selected memory cell selects the output DO2 from between the input data DIN and the output DO2. As a result, an output DI2 is set to the value of the output DO2.

Subsequently, an operation of rewriting the read data is initiated. That is, the write control signal WE shifts to the High level so that the output of the AND circuit 251 in the write circuit 250-1 corresponding to the memory cell 210-1 shifts to the High level. As a result, the NMOS transistor QN10 becomes conductive so that the write bit line WBL1 is discharged from the power source level Vdd to shift to a ground level. On the other hand, the write bit line XWBL1 is maintained on the level Vdd.

At the same time, the write circuit 250-2 corresponding to the memory cell 210-2 as the non-selected memory cell also operates to discharge the write bit line WBL2 or XWBL2.

Subsequently, the write word line WWL shifts to the High level to make conductive the NMOS transistors QN3 and QN4 of the memory cells 210-1 and 210-2. As a result, data in the write bit lines WBL1 and XWBL1 is written to the memory cell 210-1, while data in the write bit lines WBL2 and XWBL2 is written to the memory cell 210-2.

After the writing is completed, the write word line WWL shifts to the Low level, and the write control signal WE shifts to the Low level. As a result, the write bit lines WBL1, WBL2, XWBL1, and XWBL2 are each charged to the level Vdd by the precharge circuit (not shown).

Next, during a read cycle from the memory cell 210-1, only the read operation during the write cycle described above is performed, as shown in FIG. 5. That is, the read word line RWL shifts to the High level to read the data from the memory cells 210-1 and 210-2 into the read bit lines RBL1 and RBL2, and the multiplexer 260 outputs either of the outputs DO1 and DO2 latched by the lath circuits 230-1 and 230-2 to the outside in accordance with the value of the column address signal CA.

Thus, in the semiconductor integrated circuit shown in Non-Patent Document 1, the read operation is performed in advance even during the write cycle, and output data is latched in correspondence to each of the columns composing the memory cell array. Subsequently, either of the external input data and the read data is selected via the multiplexer, and then rewritten to the memory cells through the write circuits. As a result, even though stored data is destroyed by charges flowing from the write bit line connected to the non-selected memory cell into the memory cell node when the write word line is caused to shift to the High level, the data prior to the destruction can be rewritten. That is, with the semiconductor integrated circuit, it becomes possible to guarantee data in the non-selected memory cell.

However, the semiconductor integrated circuit described in Non-Patent Document 1 has the problem that, since the read operation needs to be performed in advance even during the write cycle, a write cycle time is elongated.

In addition, even during the write cycle, charging and discharging of the read bit lines is performed to perform the read operation. This leads to another problem of a larger consumed current than in an inherent operation which performs only data writing with the write bit lines.

There is still another problem of an area increase since the latch circuits and the multiplexer circuits need to be disposed correspondingly to the respective columns of the memory cells composing the memory cell array.

SUMMARY OF THE INVENTION

The present invention has been achieved by focusing attention on the problems described above, and it is therefore an object of the present invention to allow, in a semiconductor integrated circuit comprising flip-flop memory cells, such as an SRAM, a reduction in cycle time, a reduction in power consumption, and the suppression of an area increase, while circumventing the destruction of data in a non-selected memory cell during a write cycle.

To solve the problems described above, in a semiconductor integrated circuit according to the present invention, the potential of each word line during a write operation is set lower in a first period as a predetermined period after the initiation of a write cycle than in a second period as a predetermined period after the first period. In addition, the potential difference between bit lines in a bit line pair is amplified in the first period.

For example, an embodiment of the present invention is a semiconductor integrated circuit including: a plurality of memory cells arranged in rows and columns; a plurality of write word lines and a plurality of read word lines which are placed correspondingly to the respective rows of the plurality of memory cells; a plurality of write bit lines and a plurality of read bit lines which are placed correspondingly to the respective columns of the plurality of memory cells; a plurality of sense amplifiers provided correspondingly to the respective write bit lines to amplify potentials of the corresponding write bit lines; and a plurality of write-word-line drivers disposed correspondingly to the respective rows of the plurality of memory cells to drive the write word lines in the corresponding rows, wherein each of the memory cells includes a flip-flop having a pair of storage nodes for storing data, a write transistor connected to each of the corresponding write bit line and the corresponding write word line, and a read transistor connected to each of the corresponding read bit line and the corresponding read word line, during a write cycle, the selected write-word-line driver drives the corresponding write word line such that a potential of the corresponding write word line is lower in a first period as a predetermined period after an initiation of the write cycle than in a second period as a predetermined period after the first period, and the sense amplifiers amplify the potentials of the corresponding write bit lines in the first period.

The arrangement can suppress the entrance of charges flowing from the bit line into the memory cell during a write operation. Therefore, it is possible to suppress the destruction of data stored in a non-selected memory.

DETAILED DESCRIPTION OF THE PREFERRED EMBODIMENTS

Figure 1:
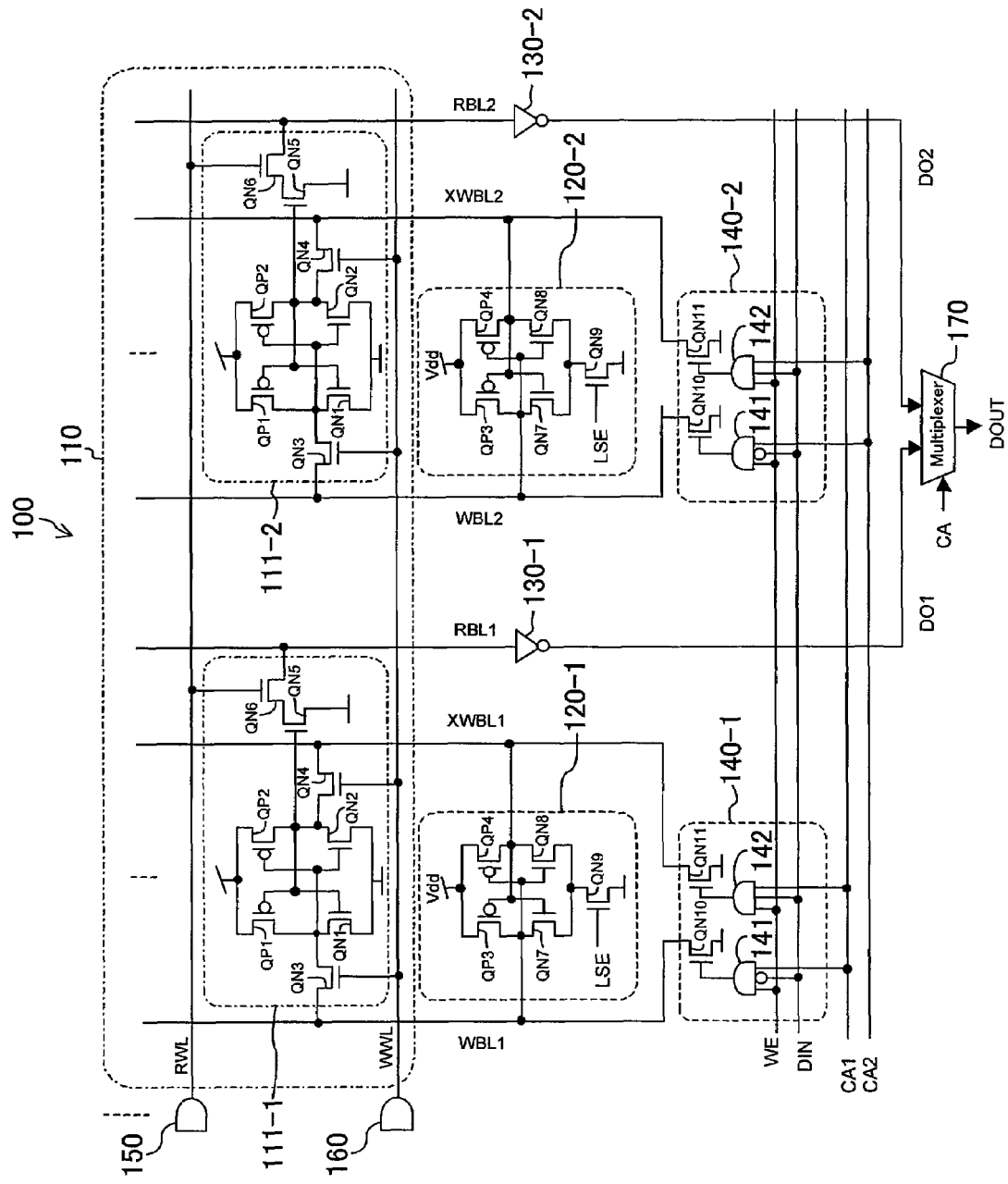
FIG. 1 is a block diagram showing a structure of a semiconductor integrated circuit 100 according to an embodiment of the present invention.

Referring to the drawings, an embodiment of the present invention will be described herein below.

FIG. 1 is a block diagram showing a structure of a semiconductor memory circuit 100 according to the embodiment of the present invention. As shown in the drawing, the semiconductor integrated circuit 100 comprises a memory cell array 110, sense amplifiers 120, inverters 130, write circuits 140, read-word-line drivers 150, write-word-line drivers 160, and a multiplexer 170. Of these components, those provided in a plurality of numbers are distinguished from each other by adding branch numbers to the ends of the reference numerals thereof (e.g., memory cell arrays 110-1, 110-2, and the like).

The memory cell array 110 comprises a plurality of memory cells 111 arranged in rows and columns. FIG. 1 shows the memory cells 111 corresponding to one row and two columns. To identify the individual memory cells 111, the branch numbers are added to the ends of the reference numerals thereof (memory cells 111-1 and 111-2).

The memory cell array also comprises pairs of word lines (e.g., a pair of RWL and WWL) placed correspondingly to the respective rows of the memory cells 111, read bit lines (e.g., RBL1 and RBL2) placed correspondingly to the respective columns of the memory cells 111, and pairs of write bit lines (e.g., a pair of WBL1 and XWBL1, and a pair of WBL2 and XWBL2) placed correspondingly to the respective columns of the memory cells 111. The read word line RWL is used during reading, and the write word line WWL is used during writing.

Each of the memory cells 111 has the same structure as that of each of the conventional memory cells. Specifically, the memory cell 111 is composed of eight transistors, which are the PMOS transistors QP1 and QP2, and the NMOS transistors QN1 to QN6. The PMOS transistors QP1 and QP2, and the NMOS transistors QN1 and QN2 constitute a flip-flop for storing data.

The NMOS transistor QN3 has a drain connected to one of the pair of write bit lines (e.g., WBL1 in the memory cell 111-1), and a source connected to one of the storage nodes of the flip-flop. The NMOS transistor QN4 has a drain connected to the other of the pair of write bit lines (e.g., XWBL1 in the memory cell 111-1), and a source connected to the other storage node of the flip-flop. The NMOS transistors QN3 and QN4 have respective gates connected to the write word line WWL. The NMOS transistors QN3 and QN4 are also termed access transistors.

The NMOS transistors QN5 and QN6 have respective gates connected to one of the storage nodes of the flip flop, and to the read word line RWL such that data in the storage node is read into the read bit line (PBL1 in the memory cell 111-1) corresponding to the memory cell 111.

The sense amplifiers 120 are provided correspondingly to the respective columns of the memory cell array 110. Each of the sense amplifiers 120 is activated by a control signal LSE to amplify the potential difference between the write bit lines in the corresponding column. For example, the sense amplifier 120-1 amplifies the potential difference between the write bit lines WBL1 and XWBL1.

The inverters 130 are provided correspondingly to the respective columns of the memory cell array 110 to amplify and output data in the read bit lines in the corresponding columns. Specifically, the inverter 130-1 amplifies and outputs data in the read bit line RBL1, and the inverter 130-2 amplifies and outputs data in the read bit line RBL2.

The write circuits 140 are provided correspondingly to the respective columns of the memory cell array 110. Each of the write circuits 140 is controlled by a column address signal (CA1 or CA2 in this example), and by a write control signal WE to write input data DIN to the memory cell 111. Specifically, each of the write circuits 140 comprises NMOS transistors QN10 and QN11, and AND circuits 141 and 142.

The AND circuit 141 receives the column address signal, an inverted signal of the input data DIN, and the write control signal WE. The AND circuit 142 receives the column address signal, the input data DIN, and the write control signal WE.

The NMOS transistor QN10 is controlled by the AND circuit 141 to supply a ground level to one of the write bit lines (e.g., WBL1 in the write circuit 140-1) in the corresponding column. The NMOS transistor QN11 supplies the ground level to the other write bit line (e.g., XWBL1 in the write circuit 140-1).

The read-word-line drivers 150 are placed correspondingly to the respective rows of the memory cell array 110 to drive the read word lines in the corresponding rows. Each of the read-word-line drivers 150 selectively operates with a row address signal (not shown).

The write-word-line drivers 160 are placed correspondingly to the respective rows of the memory cell array 110 to drive the write word lines in the corresponding rows. Each of the write-word-line drives 160 also selectively operates with the row address signal (not shown).

The multiplexer 170 receives respective outputs (DO1 and DO2) of the inverters 130-1 and 130-2, and outputs either of the outputs DO1 and DO2 as output data (DOUT) in response to a column address signal CA.

Figure 2:
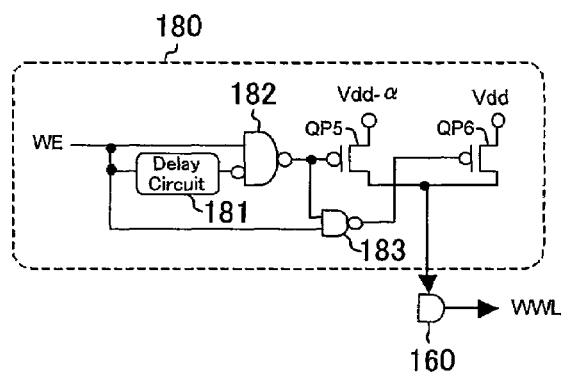
FIG. 2 is a block diagram showing a structure of a power source control circuit 180.

FIG. 2 is a block diagram showing a structure of a power source control circuit 180 for supplying power to each of the write-word-line drivers 160. The power source control circuit 180 is shared by the plurality of write-word-line drivers 160.

As shown in FIG. 2, the power source control circuit 180 comprises a delay circuit 181, NAND circuits 182 and 183, and PMOS transistors QP5 and QP6.

The NAND circuit 182 receives the write control signal WE, and an output of the delay circuit 181. The NAND circuit 183 receives an output of the NAND circuit 182, and the write control signal WE.

The PMOS transistor QP5 has a source connected to a level (Vdd−α) lower than the power source level Vdd, and a gate connected to the NAND circuit 182. The PMOS transistor QP6 has a source connected to the level Vdd, and a gate connected to the NAND circuit 183. The PMOS transistors QP5 and QP6 have respective drains connected to the power source of the write-word-line drivers 160.

The level (Vdd−α) is set to a value which does not destroy data stored in the memory cells even when the write word line reaches the level (Vdd−α).

(Operation of Semiconductor Integrated Circuit 100)

Figure 3:
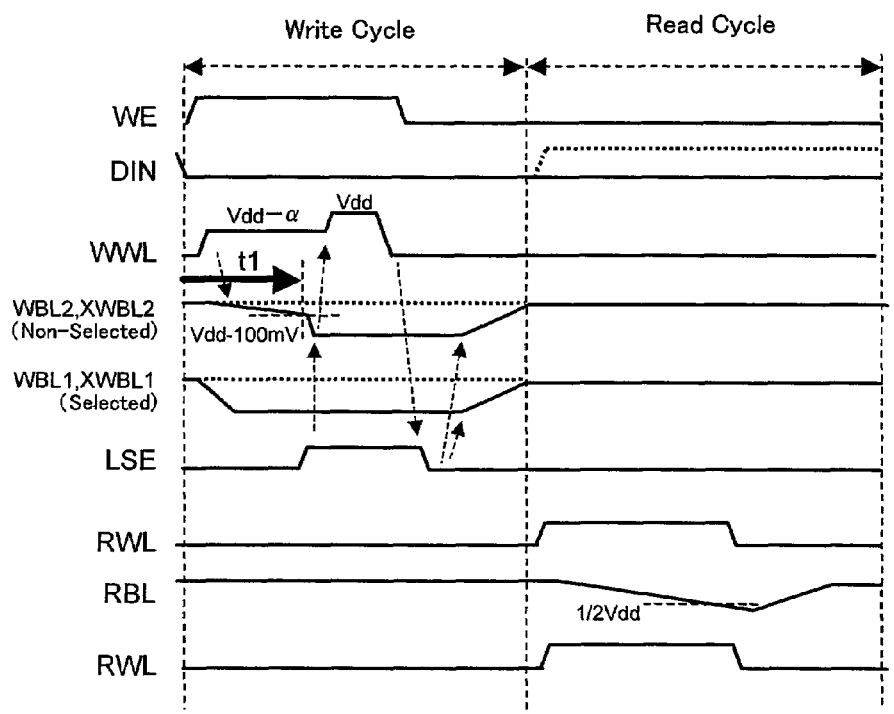
FIG. 3 is a an operation timing diagram of the semiconductor integrated circuit 100.
Figure 4:
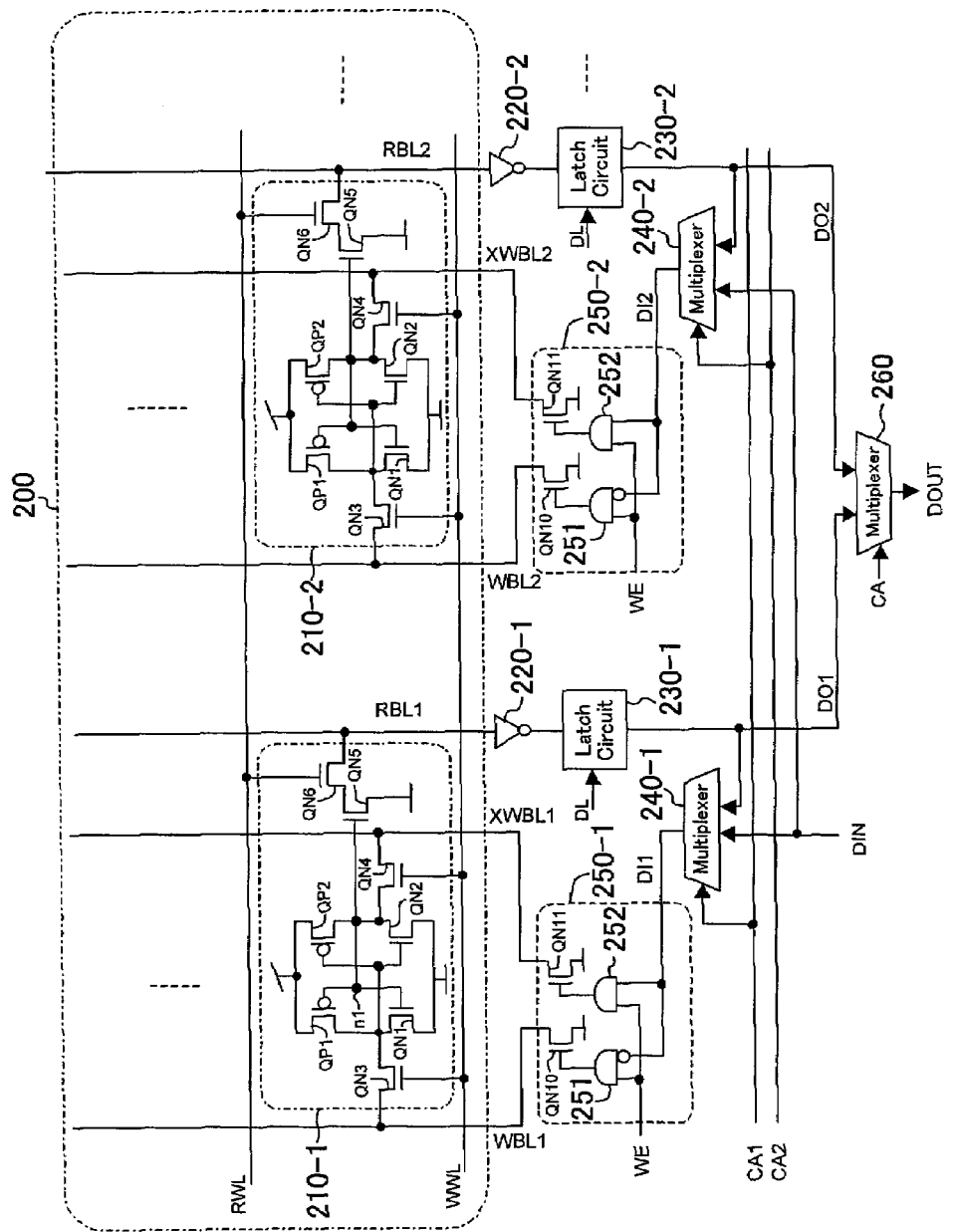
FIG. 4 is a block diagram showing a structure of a conventional semiconductor integrated circuit.

Next, a description will be given to an operation of the semiconductor integrated circuit 100 with reference to the operation timing diagram of FIG. 3.

In a non-selected state in which an access is not made to any of the memory cells, the read word lines RWL, and the write word lines WWL are each on a Low level. At this time, the memory cells 111-1 and 111-2, and the NMOS transistors QN3, QN4, and QN6 are each non-conductive.

The write bit lines WBL1, WBL2, XWBL1, and XWBL2 and the read bit lines RBL1 and RBL2 are each charged to the power source level Vdd by a precharge circuit (not shown). On the other hand, the write control signal WE, and the column address signals CA1, CA2, and CA are each on the Low level.

(During Write Cycle)

During a write cycle to the memory cell 111, the read word line RWL, and the read bit lines RBL1 and RBL2 do not operate, unlike in the conventional semiconductor integrated circuit. First, when the write control signal WE shifts to a High level, the NMOS transistors QN3 and QN4 of the memory cells 111-1 and 111-2 become conductive.

It is assumed herein that the memory cell 111-1 is selected as the memory cell to which writing is to be performed. At this time, in the write circuit 140-1 corresponding to the memory cell 111-1, the column address signal CA1 has shifted in advance to the High level so that the output of the AND circuit 141 shifts to the High level in accordance with the level of the input data DIN. As a result, the NMOS transistor QN10 becomes conductive so that the write bit line WBL1 is discharged from the power source level Vdd to shift to the ground level. On the other hand, the write bit line XWBL1 is maintained on the level Vdd.

Subsequently, the write word line WWL shifts to the High level. First, in the power source control circuit 180, the output of the NAND circuit 182 shifts to the Low level, while an output of the NAND circuit 183 shifts to the High level. At this time, the PMOS transistor QP5 becomes conductive, while the PMOS transistor QP6 is non-conductive. Accordingly, the power source level of the write-word-line driver 160 becomes the level (Vdd−α) lower than the level Vdd, and the High level of the write word line WWL becomes the level (Vdd−α).

By the shifting of the write word line WWL to the level (Vdd−α), either of the write bit lines WBL2 and XWBL2 is discharged based on data stored in the flip-flop in the non-selected memory cell 111-2. By setting the write word line WWL to the level (Vdd−α), the entrance of charges flowing from the write bit lines into the memory cell 111-1 is suppressed, and the destruction of data stored in the non-selective memory cell 111-2 can be thereby suppressed.

When the potential of the write bit line WBL2 or XWBL2 decreases to a value lower than the power source level Vdd by about 10 mV, and reaches a level which allows the sense amplifier 120-2 to amplify the potential difference between the write bit lines WBL2 and XWBL2, the control signal LSE shifts to the High level. As a result, either of the write bit lines WBL2 and XWBL2 rapidly shifts to the ground level, so that the amplification is completed.

Subsequently, when an output of the delay circuit 181 in the power source control circuit 180 is inverted, and the output of the NAND circuit 182 shifts to the High level, the PMOS transistor QP5 becomes non-conductive. At the same time, the output of the NAND circuit 183 shifts to the Low level, and the PMOS transistor QP6 becomes conductive to supply a potential on the level Vdd to the power source of the write-word-line driver 160. As a result, the level of the write word line WWL shifts from the level (Vdd−α) to the level Vdd.

The elevation of the level of the write word line WWL to the level Vdd allows the respective potentials of the write bit lines WBL1 and WBL2, and the write bit lines XWBL1 and XWBL2, which are driven by the write circuits 140, and by the sense amplifiers 120, to perform rapid writing to the memory cell 111-1 without malfunction.

When the writing to the memory cell 111-1 is completed, the write control signal WE shifts to the Low level, and the write word line WWL shifts to the Low level. Thereafter, the write bit lines WBL1, WBL2, XWBL1, and XWBL2 are each charged to the level of the power source Vdd by the precharge circuit (not shown).

(During Read Cycle)

An operation during a read cycle from the memory cell 111 is the same as that in the conventional semiconductor integrated circuit. That is, the read word line RWL shifts to the High level, data is read from the memory cells 111-1 and 111-2 to the read bit lines RBL1 and RBL2, and the multiplexer 170 outputs either of the outputs DO1 and DO2 to the outside in accordance with the value of the column address signal CA.

On the other hand, the control signal LSE is set to the Low level so that the sense amplifiers 120 do not operate during reading. As a result, it becomes possible to suppress power consumption.

The following is a summary of the characteristics of the semiconductor integrated circuit 100.

(1) In the semiconductor integrated circuit 100, a read operation need not be performed in advance during writing. Therefore, it is possible to shorten a cycle time, while suppressing the destruction of data in the non-selected memory cell when the write word line shifts to the High level.

That is, the present embodiment discharges the write bit line by initially setting the High-level potential of the write word line to the level (Vdd−α) lower than the power source level Vdd, while preventing the destruction of data in each of the non-selected memory cells connected onto the same word line. Then, the present embodiment amplifies the potential difference between the write bit lines, and then causes the potential of the write word line to shift to the higher level Vdd. This allows rapid rewriting of the data to the memory cells.

Figure 5:
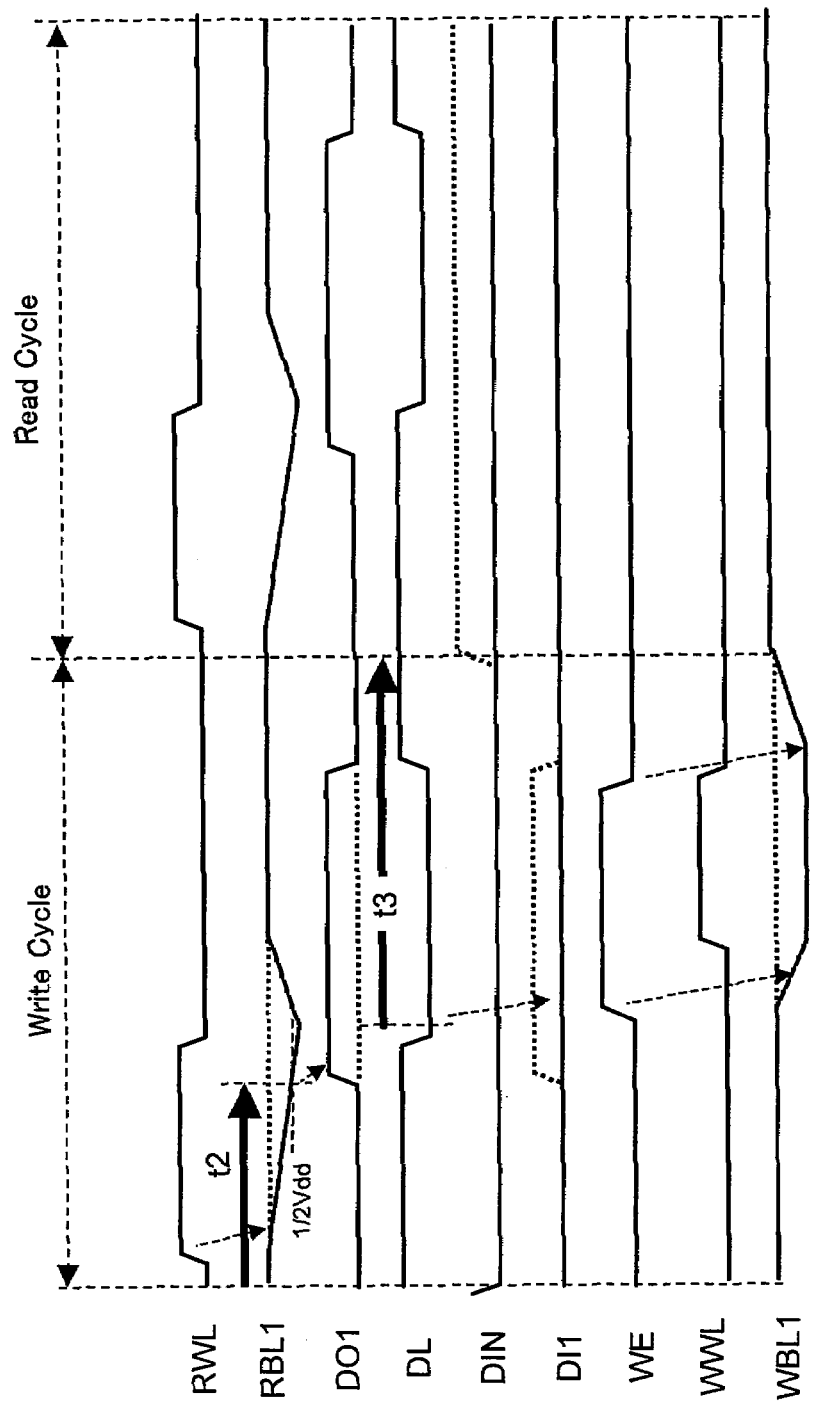
FIG. 5 is a an operation timing diagram of the conventional semiconductor integrated circuit.

By lowering the level of the write word line to (Vdd−α), the speed at which the bit line is discharged becomes lower than in the case where the write word line is on the level Vdd. However, in the structure of the conventional semiconductor integrated circuit, the output of the inverter connected to the read bit line is not determined until the level of the read bit line decreases to ½ Vdd (see FIG. 5). By contrast, in the present embodiment, the data can be determined by differential amplification by the sense amplifier when the level of the write bit line decreases to a value lower than the level Vdd by only about 100 mV (see FIG. 3).

For example, it is assumed that, when the power source level Vdd is 1.0 V, the ability of the memory cell of the conventional semiconductor integrated circuit to discharge the read bit line is 10 μA, and the ability of the memory cell of the semiconductor integrated circuit 100 to discharge the write bit line is 5 μA. In this case, when the wiring capacitances of the read bit line and the write bit line are the same, a time (t1 of FIG. 3) required by the semiconductor integrated circuit 100 to discharge the read bit line to 0.9 V is 2.5 times shorter than a time (t2 of FIG. 5) required by the conventional semiconductor integrated circuit to discharge the write bit line to 0.5 V. That is, in the semiconductor integrated circuit 100, the cycle time can be shortened.

After the discharging of the read bit line, the conventional integrated circuit further requires a time (t3 of FIG. 5) to latch data, initiate the write operation, and then drive the write bit line to perform writing. By contrast, in the semiconductor integrated circuit 100, the level of the write bit line has been determined, and it is possible to perform writing by only elevating the level of the write word line, and shorten the cycle time.

(2) In the conventional semiconductor integrated circuit, it is necessary to charge and discharge the read word line as well as the read bit lines even during writing. By contrast, in the semiconductor integrated circuit 100, the read word line as well as the read bit lines need not be operated during writing, and power consumption can be reduced accordingly.

(3) In the conventional semiconductor integrated circuit, it is necessary to dispose the latch circuits and the multiplexer circuits correspondingly to the respective columns of the memory cells composing the memory cell array, which increases an area. By contrast, in the semiconductor integrated circuit 100, it is sufficient to dispose only the sense amplifiers correspondingly to the respective columns, which allows the suppression of an area increase. The latch circuit of the conventional semiconductor integrated circuit is typically composed of a flip-flop and a transfer gate, and occupies an equal area to that occupied by the sense amplifier of the semiconductor integrated circuits 100. Accordingly, an area corresponding to an area occupied by the multiplexers can be saved.

Thus, according to the present embodiment, the effects described above in the characteristics (1) to (3) can be obtained, and the practical effects thereof are significant.

The present invention by no means limits the structure of the memory cell to the examples shown above. For example, the present invention is also applicable to a memory cell in a 6-transistor configuration.

The individual components may also be variously combined within a logically possible range.

Thus, the semiconductor integrated circuit according to the present invention has the effects of allowing a reduction in cycle time, a reduction in power consumption, and the suppression of an area increase, while circumventing the destruction of data in each of the non-selected memory cells during a write cycle. Therefore, the semiconductor integrated circuit according to the present invention is useful as a semiconductor integrated circuit comprising flip-flop memory cells or the like.

The invention claimed is:

1. A semiconductor integrated circuit comprising:
   a plurality of memory cells arranged in rows and columns;
   a plurality of write word lines and a plurality of read word lines which are placed correspondingly to the respective rows of the plurality of memory cells;
   a plurality of write bit lines and a plurality of read bit lines which are placed correspondingly to the respective columns of the plurality of memory cells;
   a plurality of sense amplifiers provided correspondingly to the respective write bit lines to amplify potentials of the corresponding write bit lines; and
   a plurality of write-word-line drivers disposed correspondingly to the respective rows of the plurality of memory cells to drive the write word lines in the corresponding rows, wherein
   each of the memory cells includes a flip-flop having a pair of storage nodes for storing data, a write transistor connected to each of the corresponding write bit line and the corresponding write word line, and a read transistor connected to each of the corresponding read bit line and the corresponding read word line,
   during a write cycle, the selected write-word-line driver drives the corresponding write word line such that a potential of the corresponding write word line is lower in a first period as a predetermined period after an initiation of the write cycle than in a second period as a predetermined period after the first period, and
   the sense amplifiers amplify the potentials of the corresponding write bit lines in the first period.

2. The semiconductor integrated circuit of claim 1, wherein the read word lines and the read bit lines do not operate during the write cycle.

3. The semiconductor integrated circuit of claim 1, wherein the sense amplifiers do not operate during a read cycle.

4. The semiconductor integrated circuit of claim 1, further comprising:
   a power source control circuit connected to a power source of the word-line drivers, wherein
   a potential of the selected word line is controlled by the power source control circuit.

* * * * *